United States Patent
Vinet et al.

(10) Patent No.: US 8,987,854 B2
(45) Date of Patent: Mar. 24, 2015

(54) MICROELECTRONIC DEVICE WITH ISOLATION TRENCHES EXTENDING UNDER AN ACTIVE AREA

(71) Applicant: Commissariat a l'Energie Atomique et aux Ene Alt, Paris (FR)

(72) Inventors: Maud Vinet, Rives sur Fure (FR); Laurent Grenouillet, Rives (FR); Yannick Le Tiec, Crolles (FR); Romain Wacquez, Marseille (FR)

(73) Assignee: Commissariat a l 'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/017,583

(22) Filed: Sep. 4, 2013

(65) Prior Publication Data
US 2014/0061798 A1 Mar. 6, 2014

(30) Foreign Application Priority Data
Sep. 5, 2012 (FR) ...................... 12 58274

(51) Int. Cl.
*H01L 27/12* (2006.01)
*H01L 21/78* (2006.01)
(Continued)

(52) U.S. Cl.
CPC ...... *H01L 27/1248* (2013.01); *H01L 21/76283* (2013.01); *H01L 21/76232* (2013.01)
USPC ............................ 257/437; 438/248; 438/421

(58) Field of Classification Search
CPC .................... H01L 27/0207; H01L 27/10829; H01L 27/1248; H01L 21/76283; H01L 21/76232; H01L 21/76224
USPC .......... 257/301, 347, 296; 438/423, 197, 248, 438/401, 421, 422
See application file for complete search history.

(56) References Cited

U.S. PATENT DOCUMENTS

| 6,806,138 B1 | 10/2004 | Cheng et al. |
| 7,550,359 B1 | 6/2009 | Cheng et al. |

(Continued)

FOREIGN PATENT DOCUMENTS

| EP | 2 390 907 A1 | 11/2011 |
| FR | 2 979 477 A1 | 3/2013 |

OTHER PUBLICATIONS

G. Greeuw et al., "Donor Generation in Monocrystalline Silicon by Halogen Implantation", Solid State Electronics, vol. 26, No. 3, 1983, pp. 241-246.

(Continued)

*Primary Examiner* — Nikolay Yushin
(74) *Attorney, Agent, or Firm* — Oblon, McClelland, Maier & Neustadt, L.L.P.

(57) ABSTRACT

A microelectronic device is provided, including: a substrate including a first semiconductor layer positioned on a dielectric layer and a second semiconductor layer; and an isolation trench disposed through the first semiconductor layer, the dielectric layer, and a part of the thickness of the second semiconductor layer, including a dielectric material and delimiting, in the first semiconductor layer, a roughly rectangular active area of the device, wherein in said part of the thickness of the second semiconductor layer, at least one portion of the dielectric material is positioned under the active area delimited by at least four side walls of the trench, and two of the at least four side walls are roughly parallel with one another and are positioned under the active area, and the other two of the at least four side walls are orthogonal to said two walls and are not positioned under the active area.

13 Claims, 6 Drawing Sheets

(51) Int. Cl.
*H01L 21/8242* (2006.01)
*H01L 21/762* (2006.01)

(56) References Cited

U.S. PATENT DOCUMENTS

| | | | |
|---|---|---|---|
| 2002/0182787 A1* | 12/2002 | Bae | 438/149 |
| 2002/0195637 A1 | 12/2002 | Kokubun | |
| 2004/0110383 A1 | 6/2004 | Tanaka | |
| 2005/0045947 A1* | 3/2005 | Chen et al. | 257/336 |
| 2008/0150074 A1 | 6/2008 | Mishra et al. | |

OTHER PUBLICATIONS

F. G. Kuper et al., "Effects of Fluorine Implantation on the Kinetics of Dry Oxidation of Silicon", Journal of Applied Physics, Aug. 1, 1986, pp. 985-990 and cover page.

French Preliminary Search Report issued Mar. 14, 2013 in French 12 58274, filed on Sep. 5, 2012 (with English Translation of Category of Cited Documents).

* cited by examiner

MICROELECTRONIC DEVICE WITH ISOLATION TRENCHES EXTENDING UNDER AN ACTIVE AREA

CROSS REFERENCE TO RELATED APPLICATION

This application claims the benefit of priority under 35 U.S.C. § 119 from prior French Patent Application No. 12 58274, filed on Sep. 5, 2012, the entire content of which is incorporated herein by reference.

TECHNICAL FIELD

The invention relates to the field of microelectronic devices produced in a substrate of the semiconductor on insulator type and containing active areas delimited by isolation trenches, for example of the STI ("Shallow Trench Isolation") type. The invention may advantageously be used for the manufacture of FDSOI (Fully Depleted on SOI) transistors using UTBB ("Ultra-Thin Body and Box") technology.

STATE OF THE PRIOR ART

The manufacture of microelectronic devices, such as transistors, in a substrate of the semiconductor on insulator type, involves the manufacture of isolation trenches, for example of the STI type, enabling the active areas of the devices to be electrically isolated from one another.

The pattern of the isolation trenches produced in the substrate is complementary to that of the active areas of the devices. An example of an isolation trench 8 of the STI type is represented in FIG. 1. This trench 8 is made from an SOI substrate 1 including a semiconductor support layer, or thick layer, 2, typically comprising silicon, covered with a thin dielectric layer 4 called BOX ("Buried Oxide") and of a thin semiconductor layer, or surface layer, 6, also comprising silicon, in which the active areas of the devices are intended to be produced. Isolation trench 8 in this case delimits two active areas 10a and 10b of two transistors produced in thin semiconductor layer 6. Isolation trench 8, which comprises a dielectric material such as $SiO_2$, goes all the way through thin semiconductor layer 6 and thin dielectric layer 4, and part way through semiconductor support layer 2.

When microelectronic devices are produced in substrate 1, after having made isolation trench 8, substrate 1 is generally subject to several steps of cleaning and etching, which may damage isolation trench 8, such as for example steps of cleaning accomplished with a hydrofluoric acid solution, and implemented after a gate etching, or prior to steps of silicon-ising or of epitaxy. The semiconductor oxide of isolation trench 8 is damaged by these steps and partially removed, both vertically and horizontally (see FIG. 2, in which the dielectric material of isolation trench 8 is partially removed). Such damage of isolation trench 8 may lead to electrical insulation problems between support layer 2 and thin layer 6, notably when electrical contacts are subsequently produced in proximity to isolation trench 8. In the example of FIG. 3, an electrical contact 12 is intended to contact electrically a portion of active area 10b located in proximity to isolation trench 8 which is, for example, a source or drain region of a transistor produced in active area 10b. And, in current technological nodes, bearing in mind the small distance between two active areas (equal to approximately 50 nm using 20 nm technology) which is equal to the width of an isolation trench, a slight misalignment during the lithography used to make this electrical contact 12 may lead to a displacement of this electrical contact 12 on isolation trench 8. Such a displacement may also be intentional, since some electrical contacts are produced deliberately jutting out, or extending, beyond isolation trench 8. And, bearing in mind the partial removal of the $SiO_2$ of isolation trench 8, this displacement may lead to a short-circuit between active area 10b made in thin semiconductor layer 6 and semiconductor support layer 2 (in the example of FIG. 3, a portion of electrical contact 12 is found in a recess formed by the partial removal of the dielectric material of isolation trench 8, short-circuiting by this means thin layer 6 with support layer 2).

To resolve this problem of damage of the isolation trenches, a solution represented in FIG. 4 consists, when an isolation trench 15 is produced, in firstly covering the walls (side walls+back wall) of the trench with a fine layer 14 ("liner") comprising a dielectric material which is more resistant than the semiconductor oxide used to produce isolation trench 8, for example silicon nitride.

The remaining space of the trench is then filled by silicon oxide 16.

The portions of layer 14 of SiN forming the side walls of isolation trench 15 improves the resistance of isolation trench 15 in relation to these steps of cleaning and etching.

However, although this solution partly prevents the isolation trench from being damaged, it does not enable the previously mentioned risk of short-circuit to be eliminated completely. Indeed, when etching the electrical contacts, a thin nitride layer (called the "contact etch stop layer") present must be etched, which will lead to the simultaneous etching of nitride layer 14, and therefore destroy the seal produced by the nitride of this layer 14. In addition, when layer 14 comprises a dielectric with high permittivity, deterioration of electrical performance is observed due to a diffusion of oxygen occurring through this liner.

DESCRIPTION OF THE INVENTION

Thus there is a need to propose a microelectronic device including at least one active area delimited by an isolation trench which is resistant in relation to steps which may damage the material or materials of the isolation trench, which enables the short-circuits in the substrate to be prevented even if materials of the isolation trench are partially removed.

To accomplish this, it is described a microelectronic device including at least:
  a substrate including a first semiconductor layer positioned on a dielectric layer, where the dielectric layer is positioned on a second semiconductor layer,
  an isolation trench made through the first semiconductor layer, the dielectric layer and a part of the thickness of the second semiconductor layer, including at least one dielectric material and delimiting, in the first semiconductor layer, at least one active area of the device,
  and in which, in said part of the thickness of the second semiconductor layer, at least one portion of the dielectric material of the isolation trench is positioned, or extends, under the active area.

A microelectronic device is also proposed including at least:
  a substrate including a first semiconductor layer positioned on a dielectric layer, where the dielectric layer is positioned on a second semiconductor layer,
  an isolation trench made through the first semiconductor layer, the dielectric layer and a part of the thickness of the second semiconductor layer, including at least one dielectric material and delimiting at least one active area of the substrate, and in which, in at least one portion of the isolation trench, the thickness of the isolation trench in the second semiconductor layer is greater than the thickness of the isolation trench in the first semiconductor layer.

One embodiment proposes a microelectronic device including at least:
  a substrate including a first semiconductor layer positioned on a dielectric layer, where the dielectric layer is positioned on a second semiconductor layer,
  an isolation trench made through the first semiconductor layer, the dielectric layer and a part of the thickness of the second semiconductor layer, including at least one dielectric material and delimiting, in the first semiconductor layer, at least one active area of the device,
  in which, in said part of the thickness of the second semiconductor layer, at least one portion of the dielectric material of the isolation trench is positioned under the active area, the active area being of roughly rectangular shape, and delimited by at least four side walls of the isolation trench which extend through the first semiconductor layer, the dielectric layer and said part of the thickness of the second semiconductor layer,
  and in which, in said part of the thickness of the second semiconductor layer, two of the four side walls which are roughly parallel with one another are positioned under the active area and the other two side walls are not positioned under the active area.

The isolation trench thus includes, in the support layer, i.e. in the second semiconductor layer, one or more thicker dielectric regions which extend under the active area, notably where there is a risk of short-circuit and/or where the thickness of the dielectric has no or little impact on the electrical characteristics of the semiconductor device, for example in the source and drain regions of the transistor. If a portion of the dielectric material is removed from the isolation trench, the thicker dielectric regions of the isolation trench enable the second semiconductor layer to be electrically insulated in view of one or more electrical contacts jutting out, or extending beyond, over the isolation trench.

Such an isolation trench therefore includes one or more side walls which, in the second semiconductor layer, are not vertically aligned with the active area delimited by the isolation trench.

Said portion of the dielectric material of the isolation trench may be in contact with a portion of the dielectric layer which is positioned under the active area.

Said dielectric material of the isolation trench may be $SiO_2$.

The active area is of roughly rectangular shape, and is delimited by at least four side walls of the isolation trench which extend through the first semiconductor layer, the dielectric layer and said part of the thickness of the second semiconductor layer, and, in said part of the thickness of the second semiconductor layer, two of the four side walls which are roughly parallel with one another are positioned under the active area and the other two side walls are not positioned under the active area. In this configuration, said portion of the dielectric material of the isolation trench which is positioned under the active area notably corresponds to the two side walls which are positioned, or extend, under the active area. These two side walls may be in contact with a portion of the dielectric layer which is positioned under the active area.

Such an isolation trench thus has an asymmetrical profile such that in the second semiconductor layer (the support layer of the substrate), at least one of the side walls is located, or extends, under the active area in order to prevent short-circuits in the substrate, even in the event that the material or materials of the isolation trench is/are partially removed, and at least one other of the side walls is not located under the active area, in order not to modify the dimensions of the ground plane (the portion of the support layer located under the active area, and notably under the channel region) of the microelectronic device. According to different variants, it is possible to have a single one of the side walls which is located, or extends, under the active area, and the other three side walls which are not located, or do not extend, under the active area. It is also possible to have three of the side walls which are located, or extend, under the active area, and another one of the side walls which is not located, or does not extend, under the active area.

The active area may be roughly rectangular in shape, and delimited by at least four side walls of the isolation trench, and the thickness of the dielectric material of two of the four side walls of the trench, which are roughly parallel with one another, may be greater than the thickness of the dielectric material of the other two side walls of the trench.

The device may also include at least one transistor produced in the active area, and a gate of which may be positioned on a portion of the active area and on a portion of said other two side walls. The side walls which are aligned roughly perpendicularly to the gate may be those walls which do not extend under the active area (and notably under the transistor's channel region, and which are therefore aligned vertically with the active area), in order not to reduce the dimensions of the transistor's ground plane, and therefore not to move the transistor's threshold voltage away from its nominal value. In addition, the damage of the short-channel effects are reduced due to the fact that the thickness of the buried dielectric located under the channel is not modified.

As a variant, the active area may be of roughly rectangular shape, and be delimited by side walls of the isolation trench which extend through the first semiconductor layer, the dielectric layer and said part of the thickness of the second semiconductor layer, and, in said part of the thickness of the second semiconductor layer, the side walls of the isolation trench may be positioned under the active area.

In this variant, in the second semiconductor layer, all the side walls of the isolation trench may therefore "jut out" under the active area, and be in contact with a portion of the dielectric layer which is positioned under the active area. Thus, in this variant, in the second semiconductor layer, none of the side walls of the isolation trench is aligned vertically with the active area delimited by the portion of the isolation trench located in the first semiconductor layer.

A back wall of the trench may comprise at least one dielectric material.

In the dielectric layer and the first semiconductor layer, the side walls may comprise at least one semiconductor nitride layer, or high-permittivity or high-k dielectric layer (i.e. one having a dielectric constant greater than approximately 3.9). Such a liner may therefore form the upper portion of the side walls of the isolation trench.

The thickness of the dielectric material of said first of the side walls of the trench may be greater than approximately 5 times the thickness of the dielectric material of said second of the side walls of the trench.

It is also proposed a method for producing a microelectronic device, including at least the production, in a substrate including a first semiconductor layer positioned on a dielectric layer, where the dielectric layer is positioned on a second semiconductor layer, of at least one isolation trench through the first semiconductor layer, the dielectric layer and a part of the thickness of the second semiconductor layer, including at least one dielectric material and delimiting, in the first semiconductor layer, at least one active area of the device, and including, when the isolation trench is made, the production of a portion of the dielectric material of the isolation trench, in said part of the thickness of the second semiconductor layer, under the active area.

A method for producing a microelectronic device is also proposed including at least the following steps:

production, in a substrate including a first semiconductor layer positioned on a dielectric layer, where the dielectric layer is positioned on a second semiconductor layer, of at least one isolation trench through the first semiconductor layer, the dielectric layer and a part of the thickness of the second semiconductor layer, such that the trench delimits at least one active area of the device, production, in said part of the thickness of the second semiconductor layer, of at least one side wall of the isolation trench including at least one dielectric material and such that the thickness of the trench in the second semiconductor layer is greater than the thickness of the isolation trench in the first semiconductor layer.

Another embodiment proposes a method for producing a microelectronic device, including at least the production, in a substrate including a first semiconductor layer positioned on a dielectric layer, where the dielectric layer is positioned on a second semiconductor layer, of at least one isolation trench through the first semiconductor layer, the dielectric layer and a part of the thickness of the second semiconductor layer, including at least one dielectric material and delimiting, in the first semiconductor layer, at least one active area of the device, and including, when the isolation trench is made, the production of a portion of the dielectric material of the isolation trench, in said part of the thickness of the second semiconductor layer, under the active area, where the active area is of roughly rectangular shape and is delimited by at least four side walls of the isolation trench which extend through the first semiconductor layer, the dielectric layer and said part of the thickness of the second semiconductor layer, and in which, in said part of the thickness of the second semiconductor layer, two of the four side walls which are roughly parallel with one another are positioned under the active area and the other two side walls are not positioned under the active area.

Production of the isolation trench may include at least the implementation of the following steps:

etching of a trench through the first semiconductor layer, the dielectric layer and said part of the thickness of the second semiconductor layer, implantation of oxygen and/or fluorine in one or more side walls of the trench, in the second semiconductor layer, annealing of the substrate, making said portion of the dielectric material of the isolation trench positioned under the active area in said part of the thickness of the second semiconductor layer.

The annealing may be implemented in a dioxygen atmosphere.

The implantation of oxygen and/or of fluorine may be accomplished by ion beams of energy of between approximately 0.5 keV and 40 keV, and/or the dose of which is between approximately $5.10^{13}$ at·cm$^2$ and $5.10^{16}$ at·cm$^2$, aligned by forming a non-zero angle with said one or more side walls of the trench. The energy of the ion beam or beams is preferably between approximately 0.5 keV and 10 keV in order to avoid causing notable modifications of the properties of the first semiconductor layer. By using low-energy, moderate-dose ion beams, the risk of faults and of dislocations in the semiconductor which is subject to the implantation of oxygen and/or of fluorine in the form of ions is reduced. In addition the implantation may in this case be accomplished in a single direction in order that only a portion of the side walls of the isolation trench extends under the active area.

The implantation of oxygen and/or of fluorine may also be accomplished in a back wall of the trench.

The method may also include, during the production of the isolation trench, a step of production of at least one semiconductor nitride layer forming side walls of the isolation trench in the dielectric layer and of the first semiconductor layer.

The method may also include, after the production of the side walls of the isolation trench, a step of filling of the trench with at least one dielectric material.

The active area may be of roughly rectangular shape, and may be delimited by at least four side walls of the isolation trench which extend through the first semiconductor layer, the dielectric layer and said part of the thickness of the second semiconductor layer, and, in said part of the thickness of the second semiconductor layer, two of the four side walls which are roughly parallel with one another may be positioned under the active area and it is possible that the other two side walls are not positioned under the active area.

The method may also include, after the production of the isolation trench, a step of production of at least one transistor in the active area, and a gate of which may be positioned on a portion of the active area and on a portion of said other two side walls.

In one variant the active area may be of roughly rectangular shape, and be delimited by side walls of the isolation trench which extend through the first semiconductor layer, the dielectric layer and said part of the thickness of the second semiconductor layer and, in said part of the thickness of the second semiconductor layer, said side walls of the isolation trench may be positioned under the active area.

BRIEF DESCRIPTION OF THE ILLUSTRATIONS

The present invention will be better understood on reading the description of example embodiments given purely as an indication and in no sense restrictively, making reference to the appended illustrations in which.

Identical, similar or equivalent parts of the various figures described below have the same numerical references, to make it easier to move from one figure to another.

The various portions represented in the figures are not necessarily represented at a uniform scale, in order to make the figures more readable.

The various possibilities (variants and embodiments) must be understood as not being mutually exclusive, and being able to be combined with one another.

DETAILED DESCRIPTION OF PARTICULAR EMBODIMENTS

Figure 1:
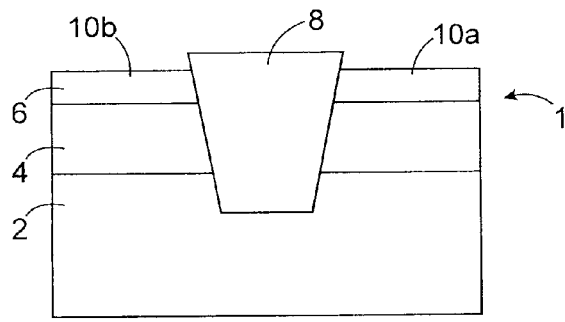
FIGS. 1 to 4 represent isolation trenches according to the prior art.
Figure 2:
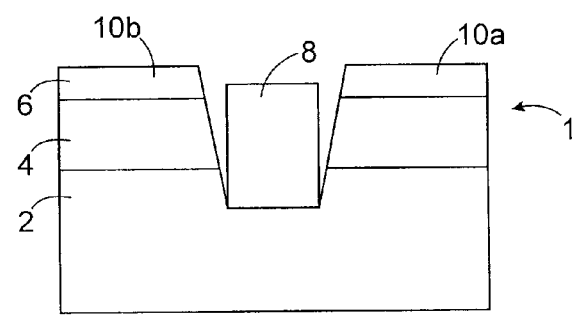
Figure 3:
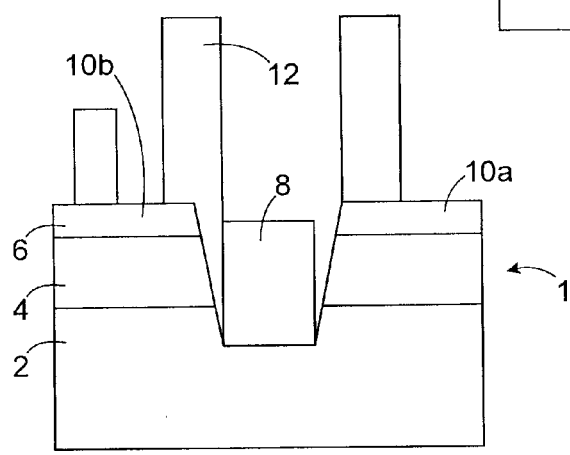
Figure 4:
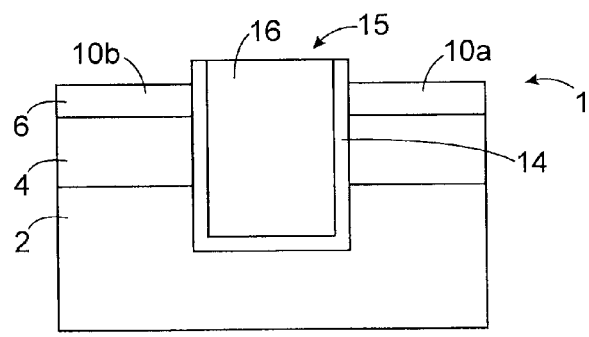
Figure 5:
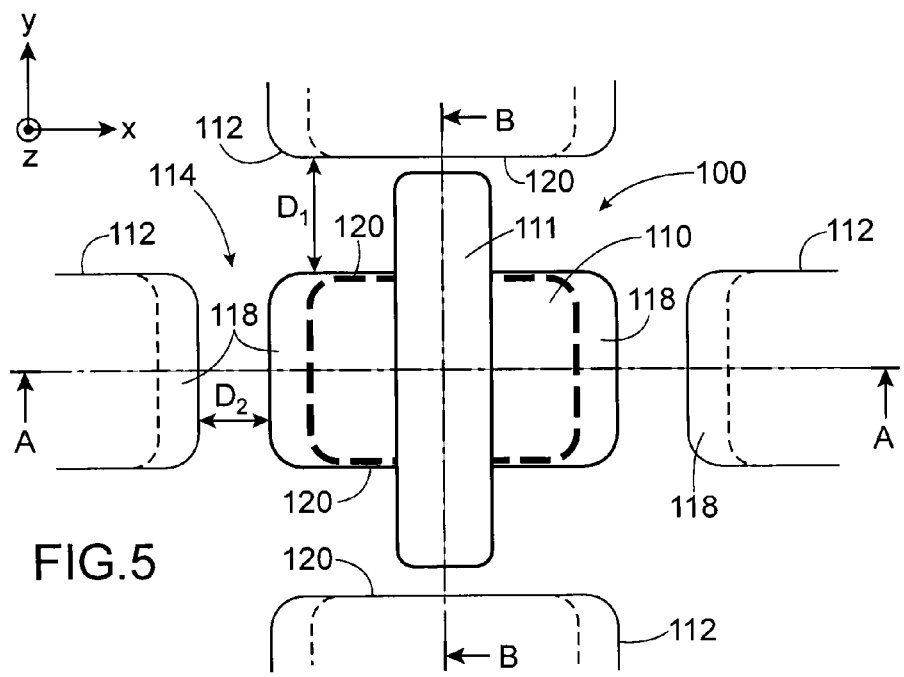
FIGS. 5 to 7 represent a microelectronic device according to a first embodiment.
Figure 6:
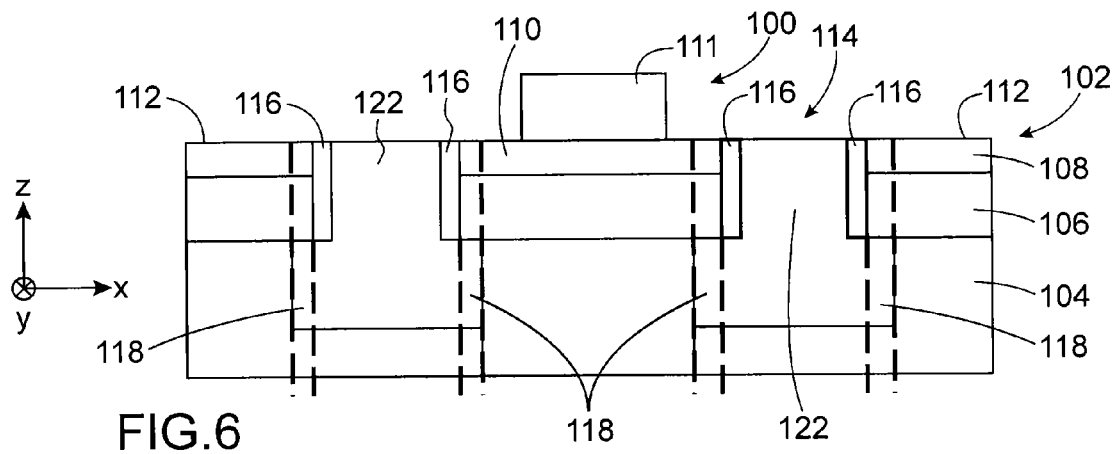
Figure 7:
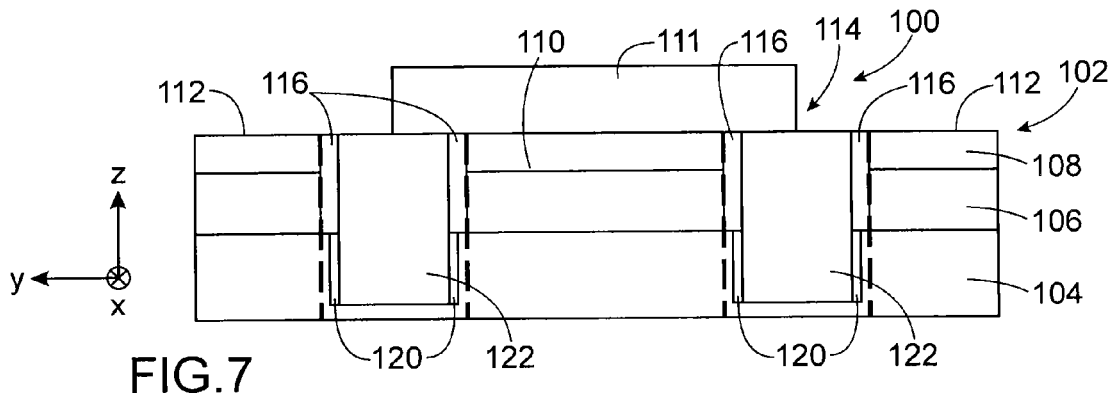
Figure 8:
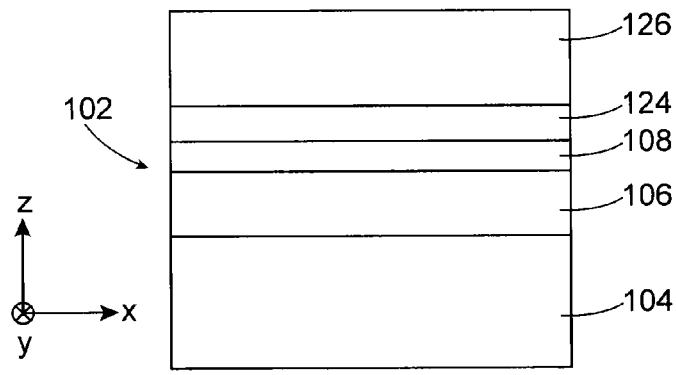
FIGS. 8 to 15B represent steps of a method to produce a microelectronic device according to the first embodiment.

Reference will firstly be made to FIGS. 5 to 7 which represent schematically a microelectronic device 100, in this case an FDSOI transistor of the UTBB type, according to a first embodiment. FIG. 5 is a top view of transistor 100, where FIGS. 6 and 7 are section views respectively along axes AA and BB represented in FIG. 5.

Transistor 100 is produced in a substrate 102 of the SOI type, including a semiconductor support layer, or thick layer, 104, for example comprising silicon, of a thin dielectric layer 106 (BOX), for example comprising $SiO_2$, and of a thin semiconductor layer, or surface layer, 108, in this case silicon. A region of thin semiconductor layer 108 forms an active area 110 of transistor 100 including a channel and source and drain regions of transistor 100. A gate 111 of transistor 100 is produced on active area 110.

Other active areas 112 of various devices are also produced in substrate 102 and represented in FIGS. 5 to 7. Active area 110 is isolated from other active areas 112 by an isolation trench 114 the pattern of which is complementary to that of all the active areas produced in substrate 102. The distance between two active areas (namely distances $D_1$ and $D_2$ represented in FIG. 5) is the width of isolation trench 114, and is for example between approximately 40 nm and 1 μm. In the case of microelectronic devices made using 20 nm technology, the width of isolation trench 114 is for example between approximately 40 nm and 200 nm. Isolation trench 114 delimits active area 110.

Isolation trench 114 is produced through thin semiconductor layer 108, thin dielectric layer 106 and a part of the thickness of the semiconductor support layer 104. In thin semiconductor layer 108 and thin dielectric layer 106, the side walls of isolation trench 114 are formed by a dielectric layer 116 comprising semiconductor nitride, in this case SiN, or comprising a $SiN/SiO_2$ twin layer, or alternatively including a high-permittivity oxide such as $HFO_2$ or HFSiON. This dielectric layer 116, the thickness of which is for example between approximately 5 nm and 15 nm, notably enables oxidation of the semiconductor of thin layer 108 to be prevented during production of isolation trench 114 which will be described below. For reasons of clarity of the illustrations, this layer 116 is not visible in FIG. 5.

In semiconductor support layer 104, the side walls of isolation trench 114 are formed by portions of dielectric material, in this case $SiO_2$, the thickness of which varies according to the alignment of these walls relative to gate 111 of transistor 100. Indeed, around active area 110 which is rectangular in shape, isolation trench 114 includes four side walls which are roughly parallel two-by-two. In the side walls of isolation trench 114 which are not covered by gate 111, i.e. which do not intersect gate 111 (where these side walls are aligned parallel with gate 111 which extends in one direction, corresponding to axis y in FIGS. 5 to 7), dielectric portions 118 the thickness of which (dimension in axis x) is between approximately 5 nm and 10 nm form the side walls of isolation trench 114 in semiconductor support layer 104. The thickness of dielectric portions 118, which depends on the design and in particular the distance between these two active areas, may be between approximately 5 nm and 50 nm. These portions 118 are positioned in particular under active area 110 (see FIG. 6). Portions 118 are in contact with the portion of dielectric layer 106 under active area 110.

Conversely, in the side walls of the trench which are aligned perpendicularly to gate 111, fine portions 120 of dielectric material (which are between approximately 1 nm and 2 nm thick) form the side walls of isolation trench 114 in semiconductor support layer 104. These portions of dielectric material 120 are not positioned under active area 110, since they are thin. The portions of dielectric material 118, 120 forming the side walls of isolation trench 114 are represented symbolically by dotted lines in FIG. 5.

The remainder of isolation trench 114 is filled with a dielectric material 122, such as $SiO_2$.

The steps of a method for producing microelectronic device 100, in this case an FDSOI transistor, according to the first embodiment, are now described in connection with FIGS. 8 to 15.

Transistor 100 is made from a standard pre-STI stack including SOI substrate 102 on which are stacked an oxide layer (for example $SiO_2$) 124 and a nitride layer (in this case SiN) 126. The layers of this stack represented in FIG. 8 have, for example, the following thicknesses:

nitride layer 126:80 nm, or alternatively between approximately 50 nm and 100 nm,
oxide layer 124:10 nm, or between approximately 3 nm and 10 nm,
thin silicon layer 108:7 nm,
thin dielectric layer 106:25 nm,
thick silicon layer 104:700 μm.

The thicknesses mentioned above are given by way of example for a transistor 100 made using UTBB 20 nm technology. These thicknesses may however vary depending on the manufacturing options envisaged, and according to the technological node in which the device is produced.

Figure 9A:
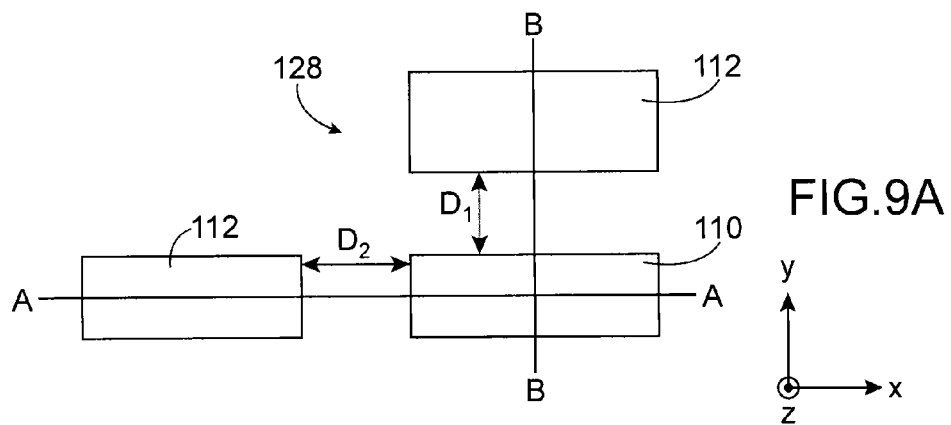
Figures 9B, 9C:
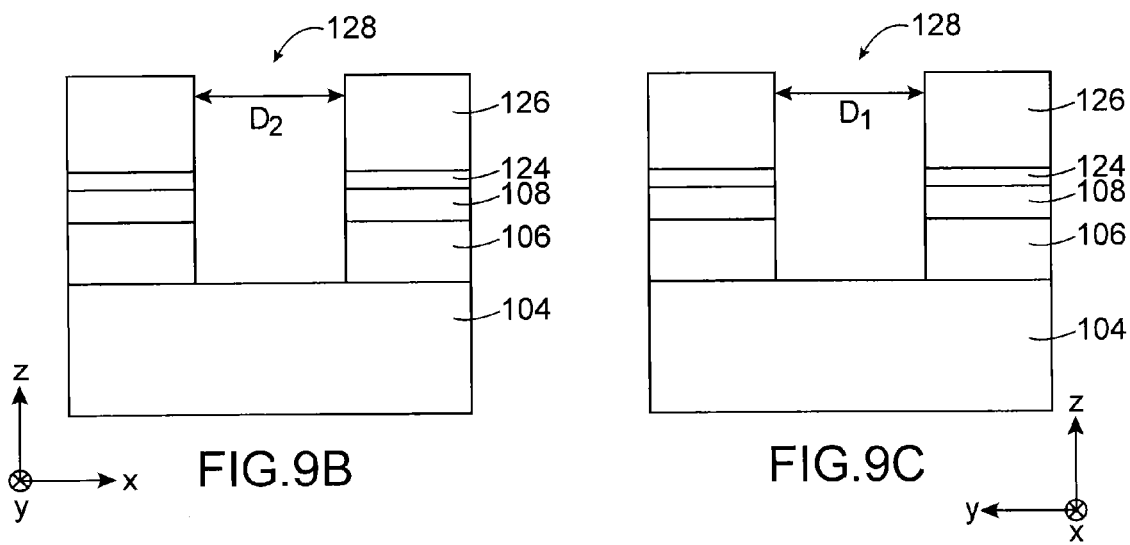

A trench 128, the pattern of which is complementary to that of the active areas to be produced in the substrate, is etched, for example using anisotropic etching, through nitride layer 126, oxide layer 124, thin semiconductor layer 108 and thin dielectric layer 106 (but not through thick layer 104). In the example of FIGS. 9A to 9C (FIGS. 9B and 9C represent respectively section views along axes AA and BB represented in FIG. 9A), active area 110 of transistor 100 is spaced from other active areas 112 by a distance $D_1$ or $D_2$ of between approximately 40 nm and 50 nm, equal to the width of trench 128.

Figure 10A:
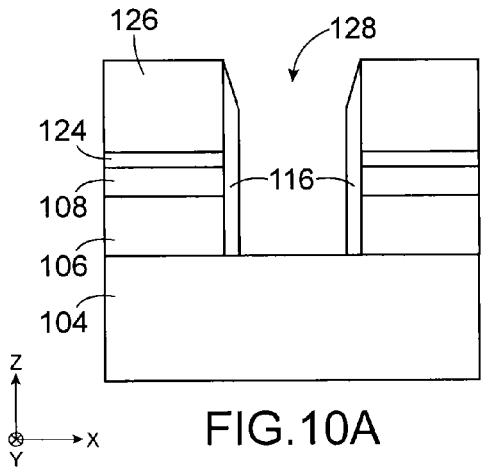
Figure 10B:
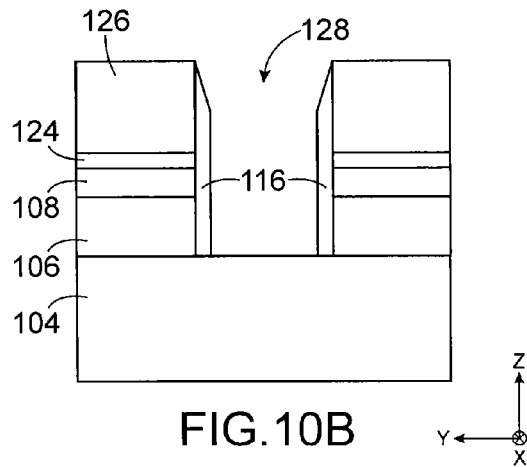

The side walls of trench 128 are then protected by covering them with dielectric layer 116 including, for example, semiconductor nitride, in this case SiN (FIGS. 10A and 10B). Dielectric layer 116 is made as a spacer around the remaining portions of layers 126, 124, 108 and 106, for example with a thickness of between approximately 3 nm and 15 nm.

Figure 11A:
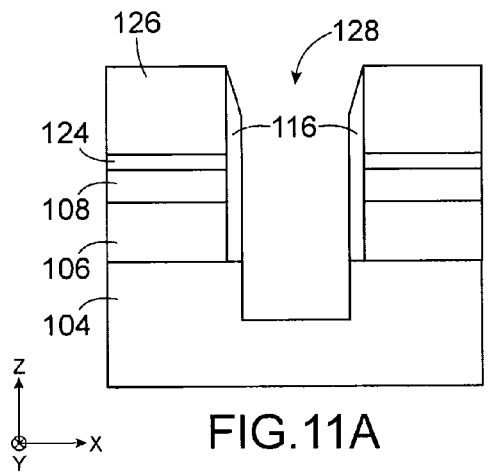
Figure 11B:
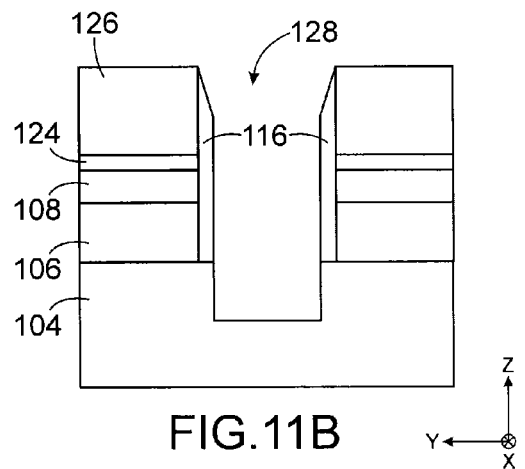

As represented in FIGS. 11A and 11B, trench 128 is then extended through a part of the thickness of the semiconductor support layer 104. In the example described here, the total depth of trench 128 is for example equal to approximately 200 nm, or between approximately 100 nm and 300 nm.

Figure 12A:
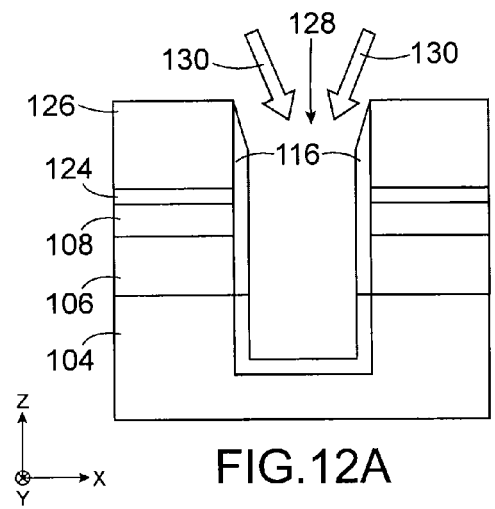
Figure 12B:
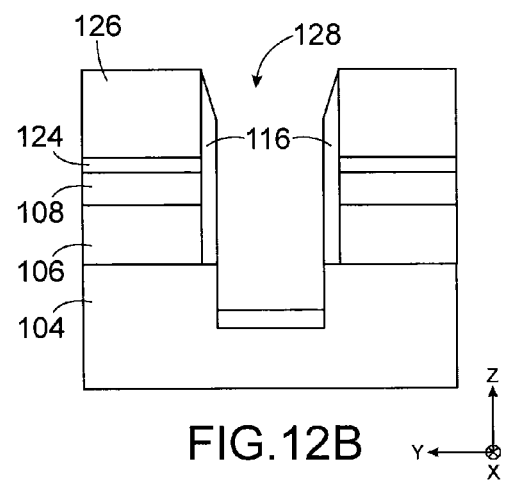

As represented in FIGS. 12A and 12B, an implantation of oxygen and/or of fluorine, and/or of any other highly electronegative element and/or an element favouring the oxidation of the semiconductor of support layer 104, is undertaken in a portion of the side walls of trench 128, in semiconductor support layer 104. In the first embodiment described here, this implantation is produced only in the side walls intended to be aligned parallel with the gate of transistor 100, i.e. extending parallel with axis y. Such an implantation is accomplished via ion beams 130 forming a zero angle with plane (X,Z). Ion beams 130 do not therefore accomplish an implantation in the side walls of trench 128 extending parallel with axis X. Beams 130 form, for example, an angle equal to approximately 15° relative to the normal to substrate 102 (i.e. an angle of approximately 15° relative to axis z). The angle of beams 130 will be modified according to the depth of trench 128 and its side dimensions (width), and may be, for example, between approximately 5° and 30°.

Figure 13A:
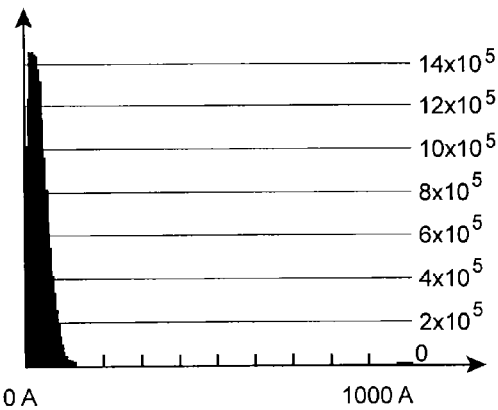
Figure 13B:
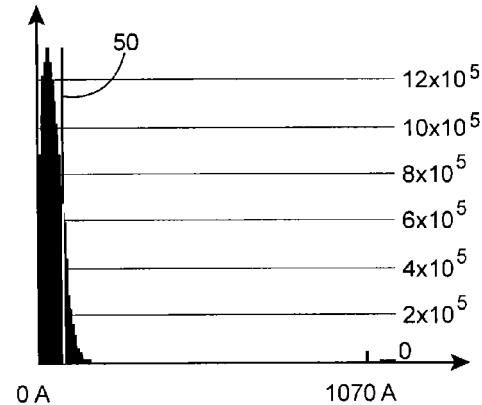

Nitride layer 116 made along the side walls of trench 128, in layers 106, 108, 124 and 126 of the stack, notably protect thin silicon layer 108 from beams 130, by this means preventing the implantation of oxygen and/or of fluorine in thin silicon layer 108. As an illustration, FIGS. 13A and 13B represent the ratios of concentrations $at \cdot cm^{-3}/at \cdot cm^{-2}$ obtained respectively in silicon (FIG. 13A) and in silicon covered with a layer of SiN of thickness equal to approximately 6 nm (FIG. 13B), as a function of the depth in the implanted material or materials. It can be seen in FIG. 13B that the silicon (reference 50 is the SiN/Silicon limit) is almost unaffected by the implantation of oxygen accomplished.

The entire back wall of trench 128 is also implanted in a manner comparable to the side walls which extend parallel with axis y, in semiconductor support layer 104.

The implantation is accomplished with a low energy level (for example at 1 keV), with a moderate dose, greater than approximately $1.10^{15}$ at·cm$^{-2}$, and for example equal to approximately $5.10^{15}$ at·cm$^{-2}$. By this means in the side walls of implanted semiconductors, over a depth of up to, for example, 5 nm, a concentration of implanted species (for example oxygen and/or fluorine) is obtained which is greater than approximately $1.10^{18}$ at·cm$^{-3}$, and for example between approximately $1.10^{20}$ and $5.10^{21}$ at·cm$^{-3}$.

Figure 14A:
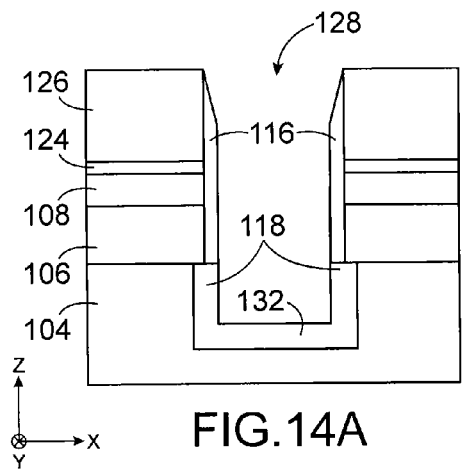
Figure 14B:
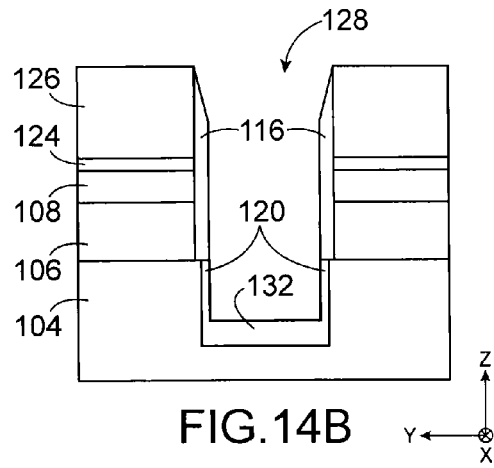

An oxidative annealing (i.e. annealing in an oxygen atmosphere) of the previously produced assembly is then accomplished, by this means transforming the silicon implanted with oxygen and/or fluorine into $SiO_2$ (the implanted fluorine enabling the silicon oxidation reaction to be accelerated). As represented in FIG. 14A, in the side walls and the back wall which contain implanted oxygen, dielectric portions 118 are obtained forming, in semiconductor support layer 104, side walls of the trench positioned under active area 110, and a dielectric portion 132 forming the back wall of the isolation trench. Portions 118 and 132 are for example between approximately 5 nm and 10 nm thick. Although the side walls, in semiconductor support layer 104, of trench 128 aligned parallel with axis x are not implanted by oxygen and/or fluorine, the oxidative annealing nevertheless produces weak oxidisation of these walls, forming fine portions 120 of $SiO_2$ which are between approximately 1 nm and 2 nm thick (FIG. 14B). Since they are thin, these portions 120 are not positioned under active area 110. This annealing is, for example, accomplished at a temperature of approximately 1000° C., for approximately 30 seconds. The fact of having implanted oxygen and/or fluorine in only a proportion of the side walls of the trench thus enables an asymmetry to be created through the created dielectric forming the side walls of the isolation trench.

Figure 15A:
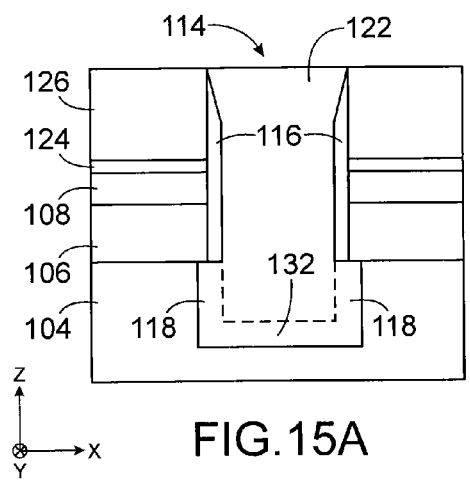
Figure 15B:
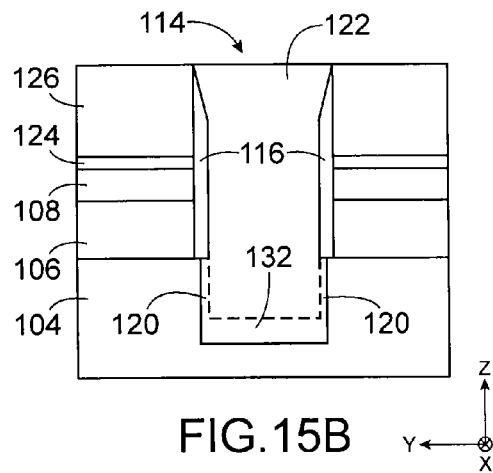

Finally, as represented in FIGS. 15A and 15B, the production of an isolation trench 114 is completed by filling the remaining space of trench 128 with a dielectric material such as $SiO_2$. The portions of dielectric material which are deposited outside the trench are etched by accomplishing, for example, a CMP, where dielectric layer 126 acts as a stop layer for this planarisation.

Layers 124 and 126 are then removed to reveal thin semiconductor layer 108. The different elements of transistor 100 are then produced from thin semiconductor layer 108 (gate dielectric, gate, creation of source and drain regions, etc.).

Figure 16:
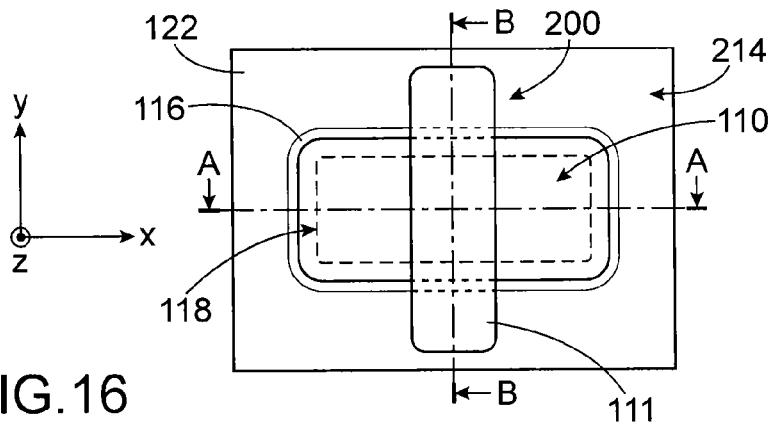
FIGS. 16 to 18 represent another microelectronic device.
Figure 17:
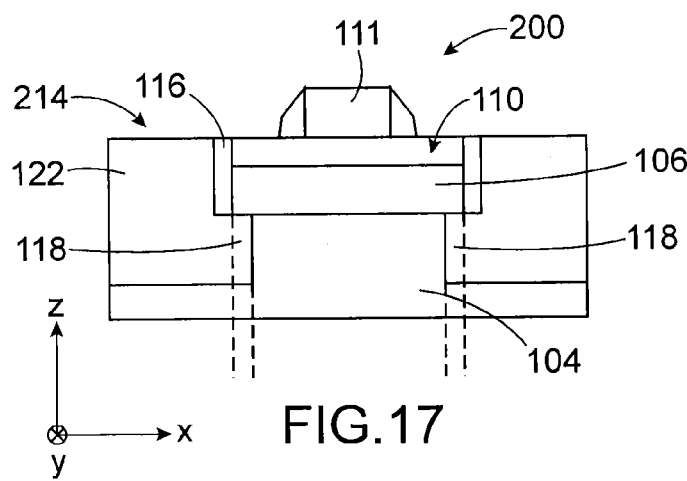
Figure 18:
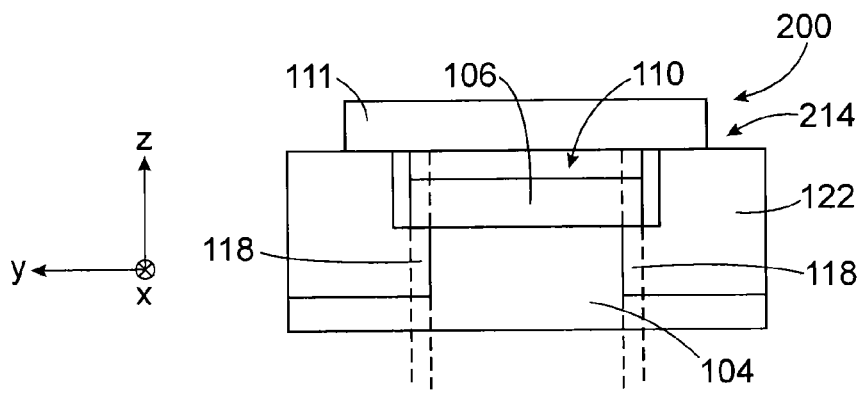

FIGS. 16 to 18 represent schematically a microelectronic device 200, in this case an FDSOI transistor of the UTBB type, according to a second embodiment. FIG. 16 is a top view of transistor 200, where FIGS. 17 and 18 are section views respectively along axes AA and BB represented in FIG. 16.

Compared to previously described device 100 in which only two of the four side walls of isolation trench 114 extend under active area 110, the four side walls of isolation trench 214 of device 200 all extend under active area 110. Dielectric portions 118 are therefore present under the entire periphery of active area 110.

Such an isolation trench 214 is produced by oxidisation of all the side walls of the trench in first semiconductor layer 104, for example in a manner comparable to the production of portions 118 of previously described transistor 100. Dielectric portions 118 are in contact with the portion of dielectric layer 106 under active area 110. Advantageously, an implantation of oxygen and/or of fluorine in the four directions of the side walls is implemented in order to facilitate side oxidisation of the walls of the trench.

The invention claimed is:

1. A microelectronic device, comprising:
   a substrate including a first semiconductor layer positioned on a dielectric layer, the dielectric layer being positioned on a second semiconductor layer; and
   at least one isolation trench disposed through the first semiconductor layer, the dielectric layer, and a part of the thickness of the second semiconductor layer, the at least one isolation trench including at least one dielectric material and delimiting, in the first semiconductor layer, at least one active area of the microelectronic device,
   wherein, in said part of the thickness of the second semiconductor layer,
      at least one portion of the at least one dielectric material of the at least one isolation trench is positioned under the at least one active area, the at least one active area being of roughly rectangular shape, and delimited by at least four side walls of the at least one isolation trench, which extend through the first semiconductor layer, the dielectric layer, and said part of the thickness of the second semiconductor layer, and
      two of the at least four side walls, which are roughly parallel with one another, are positioned under the at least one active area, and the other two of the at least four side walls are roughly orthogonal to said two of the at least four side walls and are not positioned under the at least one active area.

2. The microelectronic device according to claim 1, in which said at least one dielectric material of the at least one isolation trench is $SiO_2$.

3. The microelectronic device according to claim 1, in which said at least one portion of the at least one dielectric material of the at least one isolation trench is in contact with a portion of the dielectric layer that is positioned under the active area.

4. The microelectronic device according to claim 1, also including at least one transistor in the at least one active area, a gate of which being positioned on a portion of the at least one active area and on a portion of said other two of the at least four side walls.

5. The microelectronic device according to claim 1, in which, in the dielectric layer and the first semiconductor layer, the at least four side walls comprise at least one semiconductor nitride layer.

6. A method for producing a microelectronic device, comprising:
   providing a substrate including a first semiconductor layer positioned on a dielectric layer, the dielectric layer being positioned on a second semiconductor layer; and
   forming at least one isolation trench through the first semiconductor layer, the dielectric layer, and a part of the thickness of the second semiconductor layer, the at least one isolation trench including at least one first dielectric material and delimiting, in the first semiconductor layer, at least one active area of the microelectronic device,
   wherein, when the at least one isolation trench is formed, forming a portion of the at least one first dielectric material of the at least one isolation trench in said part of the thickness of the second semiconductor layer being under the at least one active area, the at least one active area being of roughly rectangular shape and delimited by at least four side walls of the at least one isolation trench, which extend through the first semiconductor layer, the dielectric layer, and said part of the thickness of the second semiconductor layer, and wherein, in said part of the thickness of the second semiconductor layer, two of the at least four side walls, which are roughly parallel with one another, are positioned under the at least one active area and the other two of the at least four side walls are roughly orthogonal to said two of the at least four side walls and are not positioned under the at least one active area.

7. The method according to claim 6, wherein the forming of the at least one isolation trench includes:

etching through the first semiconductor layer, the dielectric layer, and said part of the thickness of the second semiconductor layer to form the at least one isolation trench, implanting oxygen and/or fluorine in at least one of the at least four side walls of the at least one isolation trench, in the second semiconductor layer, and annealing the substrate, forming said at least one portion of the at least one first dielectric material of the at least one isolation trench to be positioned under the at least one active area in said part of the thickness of the second semiconductor layer.

8. The method according to claim 7, in which the annealing is implemented in a dioxygen atmosphere.

9. The method according to claim 7, in which the implantation of oxygen and/or of fluorine is accomplished by ion beams of energy of between approximately 0.5 keV and 40 keV, and/or the dose of which is between approximately $5.10^{13}$ at·cm$^2$ and $5.10^{16}$ at·cm$^2$, aligned by forming a non-zero angle with said at least one of the at least four side walls of the at least one isolation trench.

10. The method according to claim 7, in which the implantation of oxygen and/or of fluorine is also accomplished in a back wall of the at least one isolation trench, the back wall being another one of the at least four sidewalls of the at least one isolation trench.

11. The method according to claim 6, wherein, during the forming the at least one isolation trench, providing at least one semiconductor nitride layer on the at least four side walls of the at least one isolation trench in the dielectric layer and the first semiconductor layer.

12. The method according to claim 6, wherein, after the forming the at least one isolation trench, filling the at least one isolation trench with at least one second dielectric material, the at least one second dielectric material being a different material than the at least one first dielectric material, or being a same material as the at least one first dielectric material.

13. The method according to claim 6, wherein, after forming the at least one isolation trench, producing at least one transistor in at least one the active area, a gate of which being positioned on a portion of the at least one active area and on a portion of said other two of the at least four side walls.

* * * * *